(12) United States Patent
Lin et al.

(10) Patent No.: US 7,161,862 B1
(45) Date of Patent: Jan. 9, 2007

(54) LOW POWER ASYNCHRONOUS SENSE AMP

(75) Inventors: Mou C. Lin, High Bridge, NJ (US);
Zheng Chen, Macungie, PA (US);
Larry R. Fenstermaker, Nazareth, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 226 days.

(21) Appl. No.: 10/996,283

(22) Filed: Nov. 22, 2004

(51) Int. Cl.
*G11C 7/02* (2006.01)

(52) U.S. Cl. .................................. 365/207; 365/205

(58) Field of Classification Search ................ 365/207, 365/205, 154, 189.05
See application file for complete search history.

(56) References Cited

U.S. PATENT DOCUMENTS

| 4,843,264 | A | * | 6/1989 | Galbraith | 327/55 |
| 5,982,690 | A | * | 11/1999 | Austin | 365/205 |
| 6,088,270 | A | * | 7/2000 | Hardee | 365/189.05 |
| 6,885,222 | B1 | * | 4/2005 | Sato | 327/55 |

* cited by examiner

*Primary Examiner*—Anh Phung

(57) ABSTRACT

A memory sense amplifier includes an output and a complement output. The sense amplifier is configured such that a memory cell driving the bit line low enables latching of the bit line low by enabling pull-up of the complement output, and the memory cell driving the complement bit line low enables latching of the complement bit line low by enabling pull-up of the output.

18 Claims, 3 Drawing Sheets

LOW POWER ASYNCHRONOUS SENSE AMP

TECHNICAL FIELD

The present disclosure relates to electronic memory sense amplifiers.

BACKGROUND

Various techniques for sensing data in configuration memory cells have been employed, including clocked sense amplifiers, current mirror sense amplifiers, and inverter logic feeding directly into a flip-flop. Each of these techniques has significant drawbacks.

Clocked sense amplifiers are typically cross-coupled circuits that require specific timing between bit line signal development and a capture signal. Such circuits depend upon precise signal timing and tend to be highly sensitive to noise.

Current-mirror sense amplifiers are not dependent on a capture signal and the associated timing constraints, but leak current in certain states.

Techniques employing inverter logic feeding directly into a flip flop are dependent for their operation on both the threshold of the inverter and the timing of the clock to the flip-flop.

SUMMARY

The following summary is intended to highlight and introduce some aspects of the disclosed embodiments, but not to limit the scope of the invention. Thereafter, a detailed description of illustrated embodiments is presented, which will permit one skilled in the relevant art to make and use aspects of the invention. One skilled in the relevant art can obtain a full appreciation of aspects of the invention from the subsequent detailed description, read together with the figures, and from the claims (which follow the detailed description).

A sense amplifier circuit according to one embodiment of the invention includes first pull-up and pull-down stages coupled to a memory bit line and second pull-up and pull-down stages coupled to a complementary bit line. A first output tapped between the first pull-up and pull-down stages is coupled to disable the second pull-up stage if the first output is asserted, and a second output tapped between the second pull-up and pull-down stages is coupled to disable the first pull-up stage if the second output is asserted. The sense amplifier may also include a first non-clocked hold circuit coupled to the memory bit line and a second non-clocked hold circuit coupled to the complement memory bit line.

The pull-up stage for the first output may comprise a first transistor gate-coupled to the second output, and a second transistor gate-coupled to the complement bit line. Likewise, the pull-up stage of the second output may comprise a first transistor gate-coupled to the first output, and a second transistor gate-coupled to the bit line. The first output may be further coupled to latch the complement bit line low if asserted. The second output may be further coupled to latch the bit line low if asserted.

BRIEF DESCRIPTION OF THE DRAWINGS

The headings provided herein are for convenience only and do not necessarily affect the scope or meaning of the claimed invention In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

The invention will now be described with respect to various embodiments. The following description provides specific details for a thorough understanding of, and enabling description for, these embodiments of the invention. However, one skilled in the art will understand that the invention may be practiced without these details. In other instances, well known structures and functions have not been shown or described in detail to avoid unnecessarily obscuring the description of the embodiments of the invention. References to "one embodiment" or "an embodiment" do not necessarily refer to the same embodiment, although they may.

Figure 1:
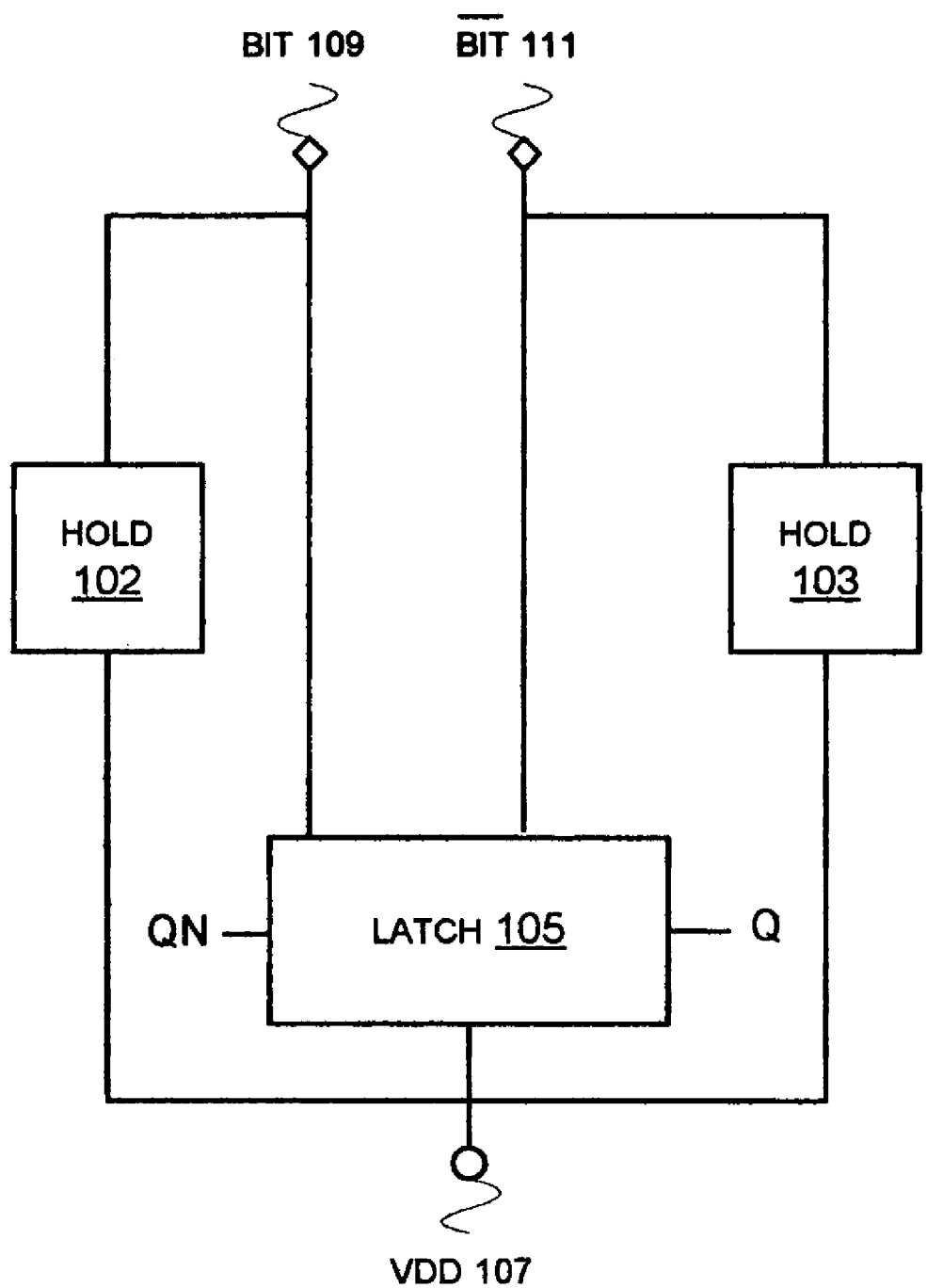
FIG. 1 is a block diagram of an embodiment of a sense amplifier circuit.

FIG. 1 is a block diagram of an embodiment of a sense amplifier circuit. The sense amplifier comprises a first non-clocked hold circuit 102 for a memory bit line 109, a second non-clocked hold circuit 103 for a complement memory bit line 111, and a latch 105. The circuit is supplied by a power source VDD 107.

The bit line 109 and complement bit line 111 may be coupled to memory cells, for example via direct connection to one or more transistors of the memory cell, or gated through multiplexing devices for selecting between columns of memory cells.

The latch 105 comprises an output Q and a complement output QN. Pre-charging the bit line 109 and the complement bit line 111 activates hold circuits 102, 103 for the bit line 109 and complement bit line 111, respectively. Both bit lines are held in a charged (logical high) state, driving both the output Q and the complement output QN to the same known state (e.g. low).

The sense amplifier is configured so that driving the complement bit line 111 low while holding the bit line 109 high drives Q high. Driving Q high disables pull-up of the complement output QN, while further latching the complement bit line 111 low.

The sense amplifier is further configured so that driving the bit line 109 low while holding the complement bit line 111 high drives QN high. Driving QN high disables pull-up of the output Q, while further latching the bit line 109 low.

More specifically, within the latch 105 the bit line 109 is coupled to disable pull-up and enable pull-down of the complement output QN, when the bit line 109 is asserted. Likewise, the bit line complement 111 is coupled to disable pull-up and enable pull-down of the output Q, when the bit line complement 111 is asserted.

The output Q is coupled to disable pull-up of the complement output QN and to latch the complement bit line 111 low when Q is asserted. The complement output QN is coupled to disable pull-up of the output Q and to the bit line 109 low when QN is asserted.

One consequence of this configuration is that when both the bit line 109 and complement bit line 111 are asserted (e.g. during pre-charging), both outputs Q and QN are pulled low. The hold circuits 102 and 103 maintain the bit line 109 and complement bit line 111 in a charged state, thus maintaining the outputs Q and QN low, until one or the other of the bit line 109 and complement bit line 111 are pulled low by a read of a memory cell to which they are coupled. If neither the bit line 109 nor complement bit line 111 is pulled low by a read operation, the situation may indicate that no memory cell is coupled at the location addressed by the read operation.

Figure 2:
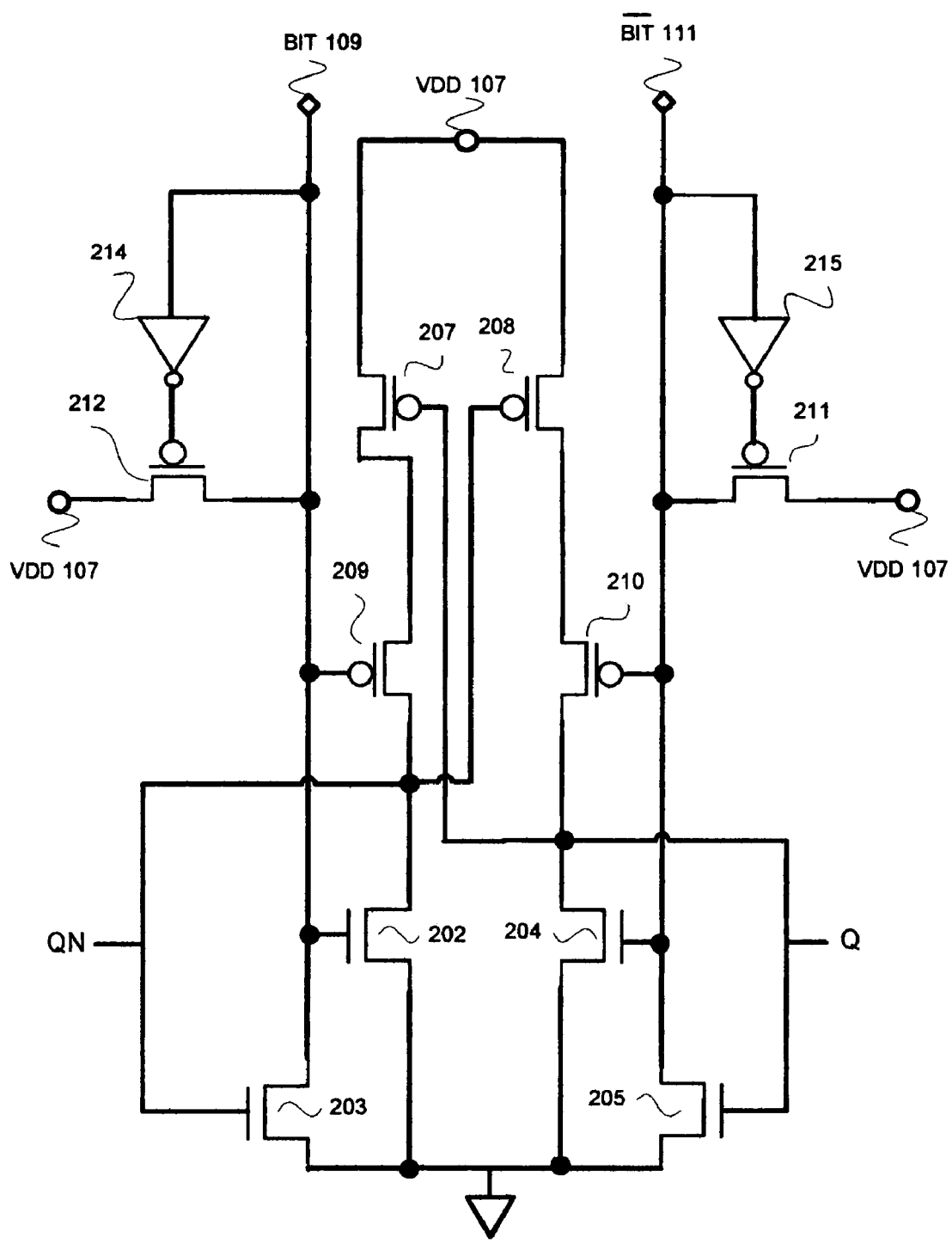
FIG. 2 is a detailed circuit diagram of an embodiment of the sense amplifier circuit of FIG. 1.

FIG. 2 is a detailed circuit diagram of an embodiment of the sense amplifier circuit of FIG. 1. The first non-clocked hold circuit may include buffered application of the bit line 109 to a gate of a pull-up transistor 212, e.g. application of the bit line 109 through an inverter 214. In some embodiments multiple inverters and/or other well-known signal buffers may be employed. The pull-up transistor 212 is source-coupled to logical high (e.g. VDD 107), so that when activated, the bit line 109 is held high until the bit line 109 is pulled low by a memory read, at which point the inverter 214 turns the transistor 212 off, thus "releasing" the bit line 109. In some embodiments multiple pull-up transistors may be employed.

The second non-clocked hold circuit may include buffered application of the complement bit line 111 to the gate of at least one pull-up transistor 211, e.g. application of the complement bit line 111 through an inverter 215 or using other signal buffer techniques. The hold circuit holds the complement bit line 111 high until the complement bit line 111 is pulled low by a memory read, at which point the inverter 215 turns transistor 211 off, thus "releasing" the complement bit line 111.

In one embodiment the latch 105 comprises an output Q tapped between a first pull-up stage (transistors 208 and 210) and a first pull-down stage (transistor 204), and an output QN tapped between a second pull-up stage (transistors 207 and 209) and a second pull-down stage (transistor 202). The output Q is coupled to the gate of transistor 207 to disable the pull-up stage of QN if asserted. Similarly, the output QN is coupled to the gate of transistor 208 to disable the pull-up stage of Q if asserted.

In some embodiments each pull-down stage may include at least one pull-down transistor, e.g. a transistor drain-coupled to ground (or other logical "low"). In some embodiments each pull-up stage may include at least a pair of P-type field effect transistors (PFETs) coupled in series.

In some embodiments the pull-up stage of output Q includes a first transistor 208 gate-coupled to the output QN. The pull-up stage of Q may also comprise a second transistor 210 gate-coupled to the complement bit line 111. Thus, asserting the bit line complement 111 will disable the pull-up stage for Q. Likewise, in some embodiments the pull-up stage for QN includes a first transistor 207 gate-coupled to the output Q, and a second transistor 209 gate-coupled to the bit line 109. Thus, asserting the bit line 109 will disable the pull-up stage for QN.

In some embodiments the output Q is further coupled to the gate of a transistor 205 to latch the complement bit line 111 low when asserted. Likewise, the output QN may be further coupled to the gate of a transistor 203 to latch the bit line 109 low when asserted. Thus, when a memory read operation causes the bit line 109 or complement bit line 111 to trend low, the low value is latched by the sense amplifier. The bit line or complement bit line that is not latched low is held high by the corresponding hold circuit.

Various techniques may be employed to ensure that pre-charging overcomes the latching of the bit line 109 and/or complement bit line 111. One manner of accomplishing this is to size the pre-charge transistors (e.g. PFETs that pull the bit line 109 and complement bit line 111 high during pre-charging) substantially larger than the latching pull-down transistors 203 and 205. In other words, the transistors that supply the pre-charge current may provide more current over the pre-charge interval than the latching transistors 203 and 205 are capable of sinking. Another technique is to provide additional transistors (e.g. NFETs) in series with the latching transistors 203 and 205, to disable latching of the bit line 109 and/or complement bit line 111 during precharging. This second technique may be preferred over using larger pre-charge transistors in some embodiments, to reduce circuit die size.

Figure 3:
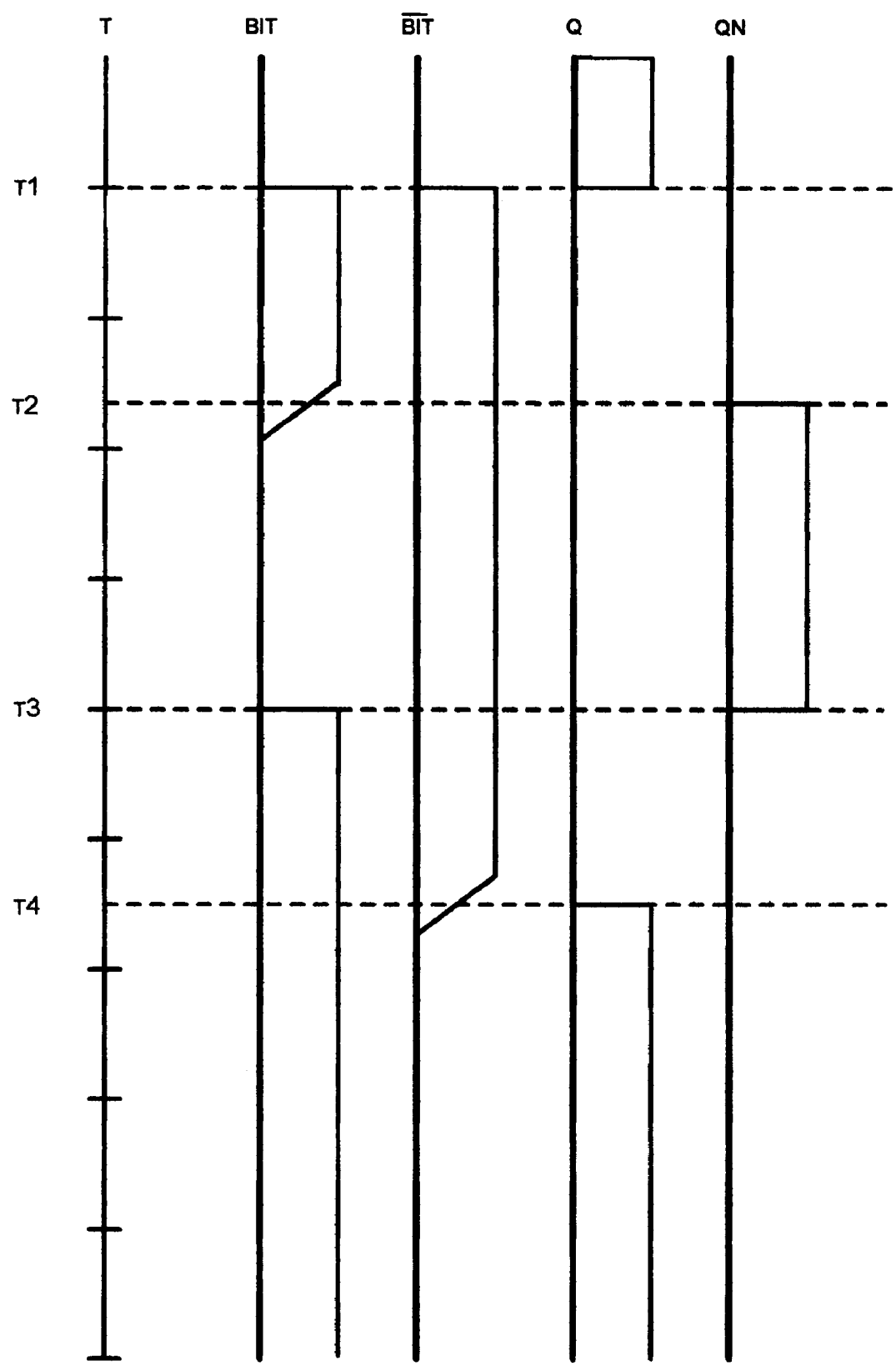
FIG. 3 is a time line diagram of an embodiment of signal timing in the sense amplifier circuit of FIGS. 1 and 2.

FIG. 3 is a time line diagram of an embodiment of signal timing in the sense amplifier circuit embodiments of FIGS. 1 and 2. At T1 both bit lines are pre-charged, driving both Q and QN low. The hold circuits maintain the bit lines in a charged state, thus maintaining Q and QN in a low state, until the occurrence of a read operation of a memory cell coupled to the bit lines. Such a read operation takes place shortly before time T2; the memory cell has a logical "zero" state, thus driving the bit line low. At T2 the bit line trends below a threshold value and consequently QN is asserted, further driving (and holding) the bit line low until the next pre-charge at T3.

A short time prior to T4, a read operation is performed; the addressed memory cell has a logical "one" state, thus driving the complement bit line low. At T4 the complement bit line trends below a threshold value and consequently Q is asserted, further driving (and holding) the complement bit line low until the next pre-charge.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

What is claimed is:

1. A sense amplifier circuit comprising:
   first pull-up and pull-down stages coupled to a bit line;
   second pull-up and pull-down stages coupled to a complementary bit line;
   a first latch circuit output tapped between the first pull-up and pull-down stages, the first output coupled to disable the second pull-up stage if the first output is asserted; and
   a second latch circuit output tapped between the second pull-up and pull-down stages, the second circuit output coupled to disable the first pull-up stage if the second output is asserted.

2. The circuit of claim 1, including:
   a first non-clocked hold circuit coupled to the bit line; and
   a second non-clocked hold circuit coupled to the complement bit line.

3. The circuit of claim 1, wherein each pull-down stage further comprises:
at least one pull-down transistor.

4. The circuit of claim 1, wherein each pull-up stage further comprises:
at least a pair of PFETs coupled in series.

5. The circuit of claim 1, wherein the first pull-up stage further comprises:
a first transistor gate-coupled to the second output, and a second transistor gate-coupled to the complement bit line.

6. The circuit of claim 1, wherein the second pull-up stage further comprises:
a first transistor gate-coupled to the first output, and a second transistor gate-coupled to the bit line.

7. The circuit of claim 1, further comprising:
the first output further coupled to pull the complement bit line low if asserted.

8. The circuit of claim 1, further comprising:
the second output further coupled to pull the bit line low if asserted.

9. A memory sense amplifier comprising:
an output and a complement output, the sense amplifier configured such that pre-charging a bit line and a complement bit line activates hold circuits for the bit line and complement bit line, holding both in a charged state, and driving both the output and the complement output to the same known state, and further configured such that a memory call driving the bit line low enables latching of the bit line low by enabling pull-up of the complement output, the sense amplifier further configured such that the memory cell driving the complement bit line low enables latching of the complement bit line low by enabling pull-up of the output.

10. The memory sense amplifier of claim 9, wherein the hold circuits for the bit line and complement bit line further comprise:
a non-clocked combination of at least one buffer and at least one transistor.

11. The memory sense amplifier of claim 9, wherein enabling latching of the bit line low by enabling pull-up of the complement output further comprises:
activating at least one bit line pull-down transistor and activating at least one complement output pull-up transistor.

12. The memory sense amplifier of claim 9, wherein enabling latching of the complement bit line low by enabling pull-up of the output further comprises:
activating at least one complement bit line pull-down transistor and activating at least one output pull-up transistor.

13. The memory sense amplifier of claim 11 further comprising at least one transistor in series with the bit line pull-down transistor, to disable latching of the bit line during pre-charge of the bit line.

14. The memory sense amplifier of claim 12 further comprising at least one transistor in series with the complement bit line pull-down transistor, to disable latching of the complement bit line during pre-charge of the complement bit line.

15. A memory sense amplifier circuit comprising:
first pull-up and pull-down stages coupled to a memory bit line;
second pull-up and pull-down stages coupled to a complementary memory bit line;
a first latch circuit output tapped between the first pull-up and pull-down stages, the first output coupled to disable the second pull-up stage and to enable the first pull-down stage if the first output is asserted; and
a second latch circuit output tapped between the second pull-up and pull-down stages, the second circuit output coupled to disable the first pull-up stage and to enable the second pull-down stage if the second output is asserted.

16. The memory sense amplifier circuit of claim 15, including
a first hold circuit coupled to the memory bit line; and
a second hold circuit coupled to the complement memory bit line.

17. The circuit of claim 15, wherein:
the first pull-up stage comprises:
a first transistor gate-coupled to the second latch circuit output, and a second transistor in series with the first transistor and gate coupled to the complement bit line; and
the second pull-up stage comprises:
a first transistor gate-coupled to the first latch circuit output, and a second transistor in series with the first transistor and gate-coupled to the bit line.

18. The circuit of claim 15, wherein the first pull-down stage comprises a transistor gate-coupled to the first latch circuit output and the second pull-down stage comprises a transistor gate-coupled to the second latch circuit output.

* * * * *

UNITED STATES PATENT AND TRADEMARK OFFICE
CERTIFICATE OF CORRECTION

PATENT NO. : 7,161,862 B1 Page 1 of 1
APPLICATION NO. : 10/996283
DATED : January 9, 2007
INVENTOR(S) : Lin et al.

It is certified that error appears in the above-identified patent and that said Letters Patent is hereby corrected as shown below:

Col. 4 line 55 Claim 1, replace "complementary bit line" with -- complement bit line --.
Col. 5 line 29 Claim 9, replace "memory call" with -- memory cell --.
Col. 6 line 16-17 Claim 15, replace "complementary memory bit line" with -- complement memory bit line --.

Signed and Sealed this

First Day of April, 2008

JON W. DUDAS
*Director of the United States Patent and Trademark Office*